US010825647B2

United States Patent
Janssen et al.

(10) Patent No.: US 10,825,647 B2
(45) Date of Patent: Nov. 3, 2020

(54) INNOVATIVE IMAGING TECHNIQUE IN TRANSMISSION CHARGED PARTICLE MICROSCOPY

(71) Applicant: FEI Company, Hillsboro, OR (US)

(72) Inventors: Bart Jozef Janssen, Eindhoven (NL); Lingbo Yu, Eindhoven (NL); Erik Michiel Franken, Nuenen (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/255,210

(22) Filed: Jan. 23, 2019

(65) Prior Publication Data
US 2019/0228949 A1 Jul. 25, 2019

(30) Foreign Application Priority Data

Jan. 25, 2018 (EP) .................................. 18153374

(51) Int. Cl.
*G06T 9/00* (2006.01)
*H01J 37/22* (2006.01)
(Continued)

(52) U.S. Cl.
CPC ............ *H01J 37/222* (2013.01); *G06T 9/005* (2013.01); *H01J 37/261* (2013.01); *H01J 37/28* (2013.01);
(Continued)

(58) Field of Classification Search
CPC ........ H01J 37/222; H01J 37/261; H01J 37/28; H01J 37/04; H01J 37/226; H01J 37/295;
(Continued)

(56) References Cited

U.S. PATENT DOCUMENTS

| 4,399,360 A * | 8/1983 | Fotino | H01J 37/26 250/311 |
| 2012/0273676 A1* | 11/2012 | Kuijper | H01J 37/26 250/307 |

(Continued)

FOREIGN PATENT DOCUMENTS

EP 0734126 A1 * 9/1996 ............... G06K 9/50

OTHER PUBLICATIONS

Xueming et al., "Electron Counting and Beam-Induced Motion Correction Enable Near-Atomic Resolution Single-Particle Cryo-EM", Nature Methods 10, 584-590 (2013) (Year: 2013).*

(Continued)

*Primary Examiner* — David E Smith

(57) ABSTRACT

A method of using a Transmission Charged Particle Microscope, comprising:
Providing a specimen on a specimen holder;
Using an illumination system to direct a beam of charged particles from a source onto said specimen;
Using an imaging system to direct charged particles that are transmitted through the specimen onto a detector,
further comprising the following actions:
In an acquisition step, lasting a time interval T, using said detector in particle counting mode to register spatiotemporal data relating to individual particle detection incidences, and to output said spatiotemporal data in raw form, without assembly into an image frame;
In a subsequent rendering step, assembling a final image from said spatiotemporal data, while performing a mathematical correction operation.

11 Claims, 2 Drawing Sheets

Figure 1:
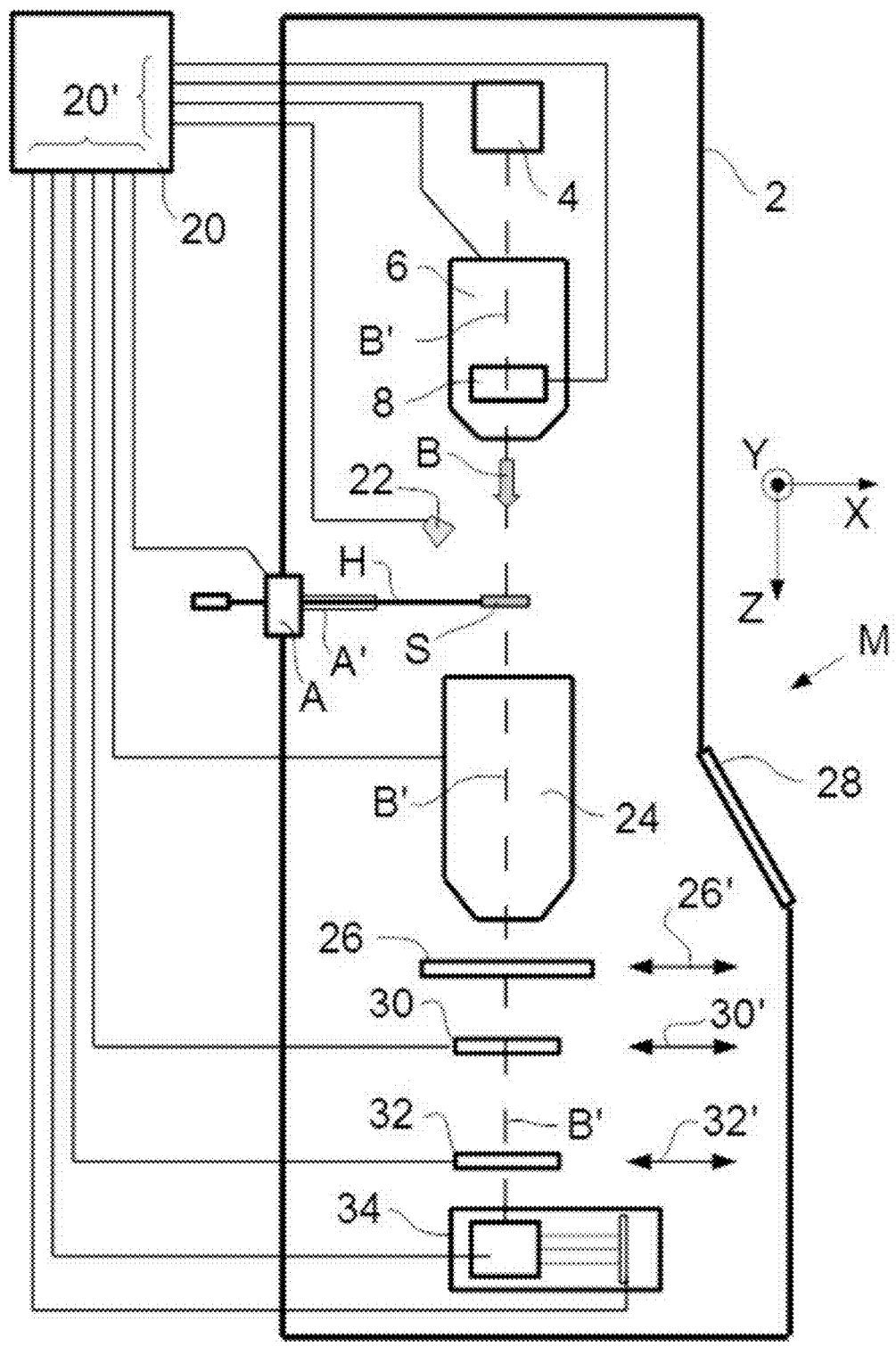

(51) Int. Cl.
*H01J 37/26* (2006.01)
*H01J 37/28* (2006.01)

(52) U.S. Cl.
CPC .......... *G06T 9/00* (2013.01); *H01J 2237/226* (2013.01); *H01J 2237/2802* (2013.01)

(58) Field of Classification Search
CPC .......... H01J 37/2955; H01J 2237/2802; G06T 9/005
See application file for complete search history.

(56) References Cited

U.S. PATENT DOCUMENTS

| | | |
|---|---|---|
| 2016/0365224 A1 | 12/2016 | Potocek et al. |
| 2017/0025247 A1* | 1/2017 | Stevens .................. H01J 37/28 |
| 2017/0125209 A1 | 5/2017 | De Boeij et al. |
| 2017/0207059 A1 | 7/2017 | Trevor et al. |

OTHER PUBLICATIONS

Xueming Li et al, "Electron Counting and Beam-Induced Motion Correction Enable Near-Atomic-Resolution Single-Particle Cryo-EM" Nature Methods 10(6), p. 584-593, 2013 (Year: 2013).*

Extended European Search Report for Application No. 18153374.6, dated Nov. 23, 2018, 14 pages.

Partial European Search Report for Application No. 18153374.6, dated Aug. 23, 2018, 11 pages.

* cited by examiner

INNOVATIVE IMAGING TECHNIQUE IN TRANSMISSION CHARGED PARTICLE MICROSCOPY

The invention relates to a method of using a Transmission Charged Particle Microscope, comprising:
- Providing a specimen on a specimen holder;
- Using an illumination system to direct a beam of charged particles from a source onto said specimen;
- Using an imaging system to direct charged particles that are transmitted through the specimen onto a detector.

The invention also relates to a Transmission Charged Particle Microscope in which such a method can be performed.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, studying ion channeling/ion backscattering (Rutherford Backscattering Spectrometry), etc.

In general, a Charged-Particle Microscope (CPM) will comprise at least the following components:
- A particle source, such as a W or $LaB_6$ source, Schottky gun or Cold Field Emission Gun (CFEG) in the case of electrons, or a Liquid Metal Ion Source (LMIS) or Nano-Aperture Ion Source (NAIS) in the case of ions, for instance.
- An illumination system (illuminating particle-optical column), which serves to manipulate a radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the specimen with respect to the beam. In general, such a specimen holder will be connected to a positioning system. When designed to hold cryogenic specimens, the specimen holder can comprise means for maintaining said specimen at cryogenic temperatures, e.g. using an appropriately connected cryogen vat.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

A Transmission Charged Particle Microscope (TCPM; such as a (S)TEM, for example), will specifically comprise:
- An imaging system (imaging particle-optical column), which essentially takes charged particles that are transmitted through a specimen (plane) and directs (focuses) them onto a sensing apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

Acquisition of images in a TCPM is often a relatively complex procedure, in which allowance has to be made for various (competing) factors. For example, specimens typically suffer radiation damage as a result of being irradiated by charged particles, so there is often a preference for relatively low irradiating beam currents/intensities, where possible. This, in turn, will lower the available imaging flux, and will therefore tend to adversely influence the attainable Signal-to-Noise Ratio (SNR). To address these issues, TCPM operators often choose to shoot a relatively large succession of component images ("frames") of a given part of a specimen at a relatively low beam intensity, and then combine these component images into a composite image, e.g. so as to measure/counteract drift effects. In an attempt to more efficiently use storage space/processing power, the component images are sometimes "simplified" before being stored, by subjecting them to a so-called quantization procedure—which can be a combination of temporal quantization (decreasing the number of component images by summing groups of two or more camera frames), spatial quantization (decreasing the number of pixels by summing groups of two or more camera pixels), and/or pixel intensity quantization (reducing the number of bits used to represent a single pixel value)—thus reducing the total file size to be stored/retrieved/processed. However, such quantization inevitably introduces errors, e.g. associated with extrapolation, interpolation and/or rounding.

It is an object of the invention to address these issues. More specifically, it is an object of the invention to provide an alternative TCPM imaging method, which uses a fundamentally different approach to conventional TCPM imaging techniques. In particular, it is an object of the invention that this new approach should offer an innovative way of correcting imaging anomalies associated with effects such as drift, distortion, aberrations and radiation damage to the specimen.

These and other objects are achieved in a method as set forth in the opening paragraph above, characterized by the following actions:

In an acquisition step, lasting a time interval T, using said detector in particle counting mode to register spatiotemporal data relating to individual particle detection incidences, and to output said spatiotemporal data in raw form, without assembly into an image frame;

In a subsequent rendering step, assembling a final image from said spatiotemporal data, while performing a mathematical correction operation.

The skilled artisan will be familiar with the concept of detection in particle counting mode, whereby the detected radiation flux is relatively low and/or the detector refresh time/dead time is relatively short, whence individual particle impacts can be registered/counted (as opposed to measuring a cumulative, multi-detection-incidence dose per detector pixel, for example).

Unlike the prior art alluded to above, the invention utilizes a detection incidence stream generated during the acquisition step, without attempting to "pre-interpret" it by composing it into image frames. By way of explanation, somewhat of an analogy can be made to computer science, whereby:

If a hard disk is cloned, a bitstream is copied from one disk to another, without interpretation of the stream; the cloning software is not concerned with the type of file (e.g. a text document, video, music file, etc.) that is represented by the cloned bits. As a result, such an operation generally proceeds relatively quickly.

If the hard disk is copied within an operating system, individual files are transferred from one disk to another. This necessarily introduces overhead, which tends to cause the operation to proceed relatively slowly.

In the present invention, the "bits" (in reference to the analogy above) are individual charged particle detection incidences, each of which is essentially a coordinate in space and time. These bits are output/streamed in "raw" (i.e. "as-is" or "native") form, without an ab initio interpretation step that attempts to assemble them into image frames (pixel arrays). This preserves data in a relatively pure form that more readily lends itself to post-acquisition correction; for example, interpolation-related losses associated with image frame generation (and an associated reduction in resolution) are avoided, leading to a "truer" data collection in which anomalies (e.g. caused by aberrations [such as coma, three-fold astigmatism, spherical aberration, defocus], distortion, drift [local and/or global], specimen damage, etc.) can be more accurately identified and mitigated, e.g. by applying a suitable coordinate transformation operation or other functional manipulation to the spatiotemporal data. The purer form of the available data greatly expedites such processing, allowing it to be done on-the-fly, if desired—though retrospective correction is also possible, of course. Moreover, as will be discussed in more detail below, the way in which the current invention uses "raw" data allows the advantageous application of highly effective compression techniques.

In the context of the present invention, one can make a distinction between different types of correction operation. For example:

In some cases, it will be possible to apply a pointwise correction directly to the raw spatiotemporal data. An example of such a correction is a spatial coordinate transformation, which may, for example, be used to correct linear drift, rotation, scaling error, distortion/magnification anisotropy, etc.

In other cases, it may be more appropriate to apply a functional correction to an assembled image, e.g. in situations in which a deviation/anomaly—such as coma or radiation-induced specimen damage, for instance—cannot be represented by a straightforward spatial coordinate transformation. Such corrections can, for example, be accomplished by modifying an employed representation function; for example, one can (locally) modify a B-spline function to counteract the deviation/anomaly concerned. The skilled artisan will understand that a spline function is a piecewise polynomial function which is continuous at the junctures ("knots") of its constituent pieces. B-spline functions of order n are basis functions of spline functions of the same order defined over the same knots, meaning that all possible spline functions can be built from a linear combination of B-splines. Fields such as computer graphics/Computer-Aided Design (CAD) often use B-spline representations of data.

In an embodiment of the invention, final image assembly is preceded by an analysis step comprising:

Sub-dividing said time interval T into a plurality of component time intervals $T_n$;

For each component time interval $T_n$, assembling a corresponding dose fraction dataset $D_n$ using spatiotemporal data acquired during $T_n$, thus producing a set $\{D_n\}$ of dose fraction datasets; and Comparing at least two of said dose fraction datasets to one another, and using this comparison to determine said correction.

This will readily reveal anomalies such as drift and radiation damage to the specimen, for example. In such an analysis step, a given dose fraction dataset may be found to deviate from a preceding or following dose fraction dataset and/or from an average of several dose fraction datasets, for example. Once such deviation has been observed, it can be used as a basis to determine a corrective action that will lead to its mitigation. The actual comparison can, if desired, be performed using pattern recognition software, which may, for example, exploit one or more of:

An Image Similarity Metric (such as an SSIM).
A (normalized) Mutual Information (MI) relation.
A (normalized) cross-correlation.
Mean Squared Difference (MSD).
Phase correlation.
Local feature-based matching, e.g. SIFT, SURF, DAISY, HOG, BRIEF, etc.

It should, however, be noted that there may also be circumstances in which a correction operation can be determined without the need for a preceding dose fraction dataset comparison step; for example, in the case of drift, position sensors in the microscope may provide output that enables the magnitude/direction of drift to be determined as a function of time, thus allowing "blind" correction of this effect.

It should be noted that, according to the present invention, the "correction operation" referred to above does not have to be applied as soon as it is determined; instead, it can be stored/buffered in a memory tag/tab/header for later application during the final image assembly procedure. Such an approach is in keeping with a tendency to keep data as "raw" as possible until a late/ultimate stage of the inventive imaging process.

As alluded to above, the present invention lends itself to data compression, which can help to save on resources required to store and process data. Because charged particle detection incidences are output in raw spatiotemporal form, without conversion into image frames, each particle impact on the detector can essentially be represented by a digital "1" (if a single pixel is impacted) or a small cluster of "1s" (if a small cluster of pixels is impacted, and an impact barycenter is determined, for example); pixel locations where no impact occurs can correspondingly be represented by a "0". Instead of representing each pixel by a separate bit, one can instead essentially count the "0s" that occur between the "1s" (so-called "run length coding"), and store these zero-counts using a much smaller number than would be required if each zero were to be given its own bit. This is feasible because:

The spatiotemporal data is intrinsically sparse;

One can make use of a so-called "stateless model", whereby one can assume that the probability p of finding a charged particle impact at a given pixel position is independent of its spatially and/or temporally neighboring pixels.

Under these circumstances, one can achieve a relatively very large compression ratio (e.g. ca. 50×), which is very close to the theoretical limit given by the Shannon Entropy. Moreover, the compression is lossless, and relatively simple decompression faithfully reproduces the original data.

In an embodiment of the invention, said mathematical correction operation comprises a filtering operation. Examples of suitable filters in this context include, for instance:

Image filters, such as:
  Linear frequency band filters (low-pass, high pass, band pass).
  Linear phase filters (for modifying phase only).
  Non-linear filters (median filter, bilateral filter, nonlocal means, anisotropic diffusion, hysteresis filter, etc.).
"Native form" filters—applied directly to native form/raw data, so as to discard and/or modify detection incidences based on certain criteria. For example:
  Eliminating detection incidences at certain time stamps
  Eliminating detection incidences at certain locations.
  Displacing detection incidences according to some model (i.e. correction function).

The invention will now be elucidated in more detail on the basis of exemplary embodiments and the accompanying schematic drawings, in which:

FIG. 1 renders a longitudinal cross-sectional view of an embodiment of a TCPM in which the present invention is implemented.

Figure 2:
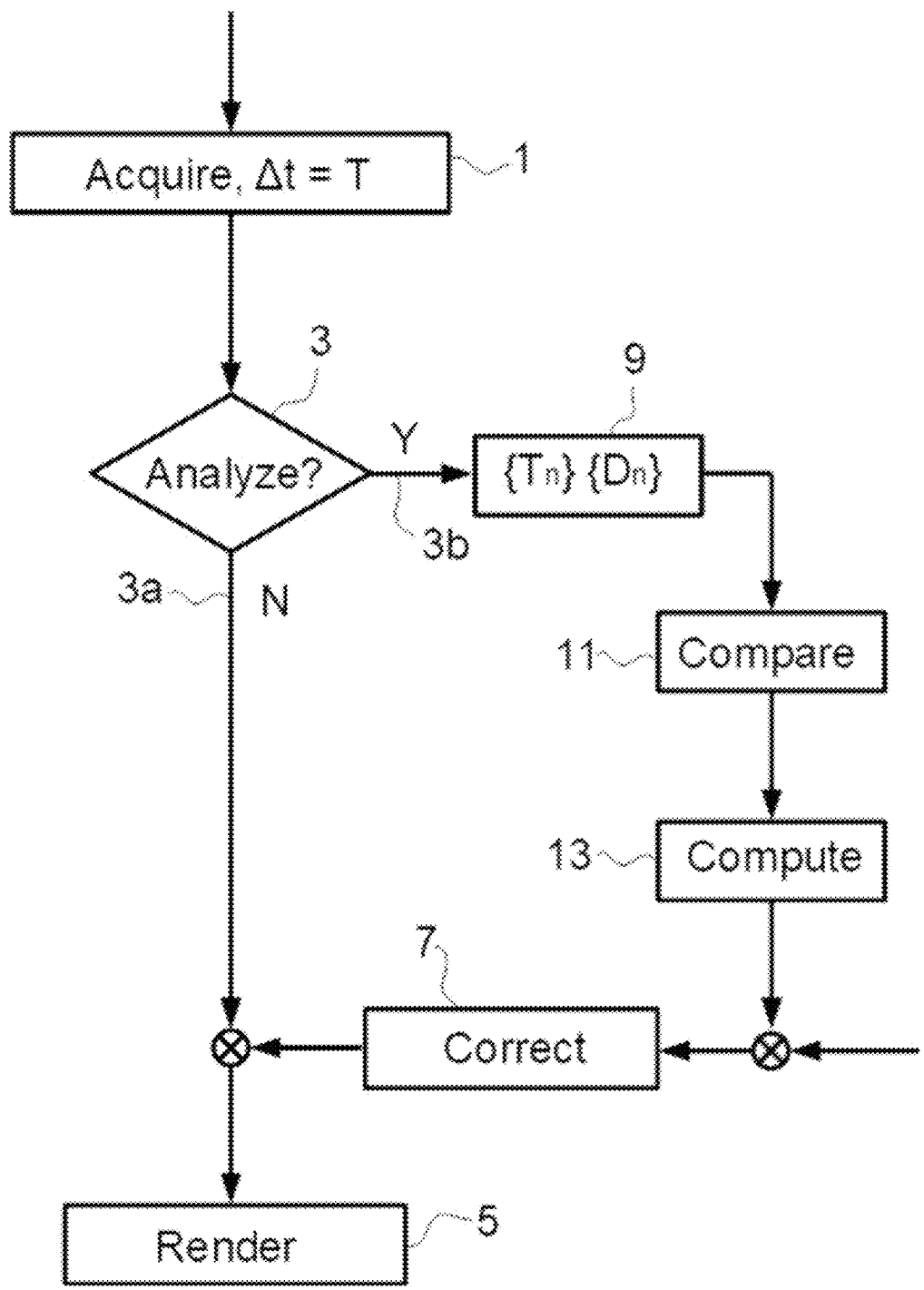

FIG. 2 illustrates an embodiment of the invention in the form of a flowchart/workflow.

In the Figures, where pertinent, corresponding parts may be indicated using corresponding reference symbols.

Embodiment 1

FIG. 1 (not to scale) is a highly schematic depiction of an embodiment of a Transmission Charged Particle Microscope M in which the present invention can be implemented; more specifically, it shows a TEM/STEM (though, in the context of the current invention, it could just as validly be an ion-based microscope, for example). In the Figure, within a vacuum enclosure 2, an electron source 4 produces a beam B of electrons that propagates along an electron-optical axis B' and traverses an electron-optical illumination system (illuminator) 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of sensing device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of detector/sensing apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

In the particular context of the present invention, the processor 20 commands the TEM camera 30 to capture/register individual charged particle impacts during a time interval T, using a relatively low beam current/dose rate (e.g. 0.02 electrons per pixel per frame). Registered impacts are stored by processor 20 in a memory in "raw"/as-is spatiotemporal form. After this acquisition step, processor 20 performs a rendering step, in which a final image is assembled from said spatiotemporal data, while performing at least one mathematical correction operation so as to mitigate undesirable anomalies/deviations, e.g. associated with one or more of drift, aberrations, distortion and specimen damage. Such a mathematical correction operation can, for example, be determined/distilled using an analysis step, performed by processor 20 prior to final image assembly, in which:

Acquisition time T is sub-divided into a plurality of component time intervals $T_n$;

For each component time interval $T_n$, a corresponding dose fraction dataset $D_n$ is assembled using spatiotemporal data acquired during $T_n$, thus producing a set $\{D_n\}$ of dose fraction datasets;

At least two of said dose fraction datasets are compared to one another, to determine said correction.

Comparison of dose fraction datasets in this manner reveals pointwise anomalies, in turn allowing counteracting coordinate transformations to be determined.

Alternatively/supplementally, a correction can be accomplished by modifying an employed representation function for the data; for example, one can (locally) modify a B-spline function to counteract a particular anomaly/deviation.

Embodiment 2

We assume that the probability of finding a charged particle at an arbitrary pixel position is $p_c$, and therefore the probability of not finding a charged particle at this position is $1-p_c$. This implies a stateless model, i.e. the probability of detecting a charged particle at a certain pixel location is independent of the detection at any other location, in both space and time. Given the low dose rate in each individual dataset, this assumption is reasonable; the added complexity to compute context-dependent probabilities is not particularly worthwhile given the marginal extra compression one could achieve.

Since the majority of pixels is 0 (no charged particle) we adopt a run-length coding approach. Under the stateless assumption, from an arbitrary start position in the dataset, the Probability Density Function (PDF) of finding a charged particle at distance k pixels from a starting position is given in theory by:

$$p(k) = p_c (1-p_c)^k$$

Theoretically, the distance k has no limit, but practically one can choose a maximum value $k_{max}$ to limit the number of symbols to $k_{max}+1$, in which case the PDF becomes:

$$p(k) = \begin{cases} p_c(1-p_c)^k & \text{if } k \in \{0, 1, \ldots, k_{max}-1\} \\ 1 - \sum_{k=0}^{k_{max}-1} p(k) & \text{if } k = k_{max} \end{cases}$$

In the compression algorithm, the found values for k are the symbols that are encoded and decoded, whence the total number of different symbols is $k_{max}+1$. Compression can be performed using Huffman coding or arithmetic coding, for example.

Theoretically, given $p_c$ (dose rate) and $N_{sub}$ (number of sub-pixel encoding bits in Cartesian x and y direction), the total amount of information in a dataset (in bits) is given by:

$$H = -p_c (\log_2 p_c) - (1-p_c) \log_2 (1-p_c) + 2 p_c N_{sub}$$

Assuming an uncompressed representation to use 8 bits per pixel (B-spline representation), the compression ratio is given by:

$$C = 8/H$$

In the current invention, C≈50 was achieved for typical dose conditions, which is close to the theoretical Shannon limit.

Embodiment 3

FIG. 2 illustrates an embodiment of the present invention in the form of a flowchart/workflow. The various illustrated steps can be elucidated as follows:

1: Acquisition, lasting a time interval T, in particle counting mode. Acquired data is stored in raw spatiotemporal form, without pre-assembly into an image frame. If desired, the data may be compressed, e.g. as set forth in Embodiment 2 above.

3: Analysis step option. Here, one may:
   3a: Proceed to image rendering step 5, while applying a pre-determined mathematical correction in step 7; or
   3b: First perform an analysis step, comprising aspects 9, 11 and 13.

5. Assemble a final image from said spatiotemporal data, while performing a mathematical correction operation.

7: Mathematical correction, applied to address imaging anomalies.

9: Sub-divide time interval T into a plurality of component time intervals $T_n$. For each component time interval $T_n$, assemble a corresponding dose fraction dataset $D_n$ using spatiotemporal data acquired during $T_n$, thus producing a set $\{D_n\}$ of dose fraction datasets.

11: Compare at least two of said dose fraction datasets to one another.

13: Use the comparison in step 11 to determine/compute (part of) a correction to be applied in step 7.

The invention claimed is:

1. A method of using a Transmission Charged Particle Microscope, comprising:
   providing a specimen on a specimen holder;
   using an illumination system to direct a beam of charged particles from a source onto said specimen;
   using an imaging system to direct charged particles that are transmitted through the specimen onto a detector, characterized by the following actions:
   in an acquisition step, lasting a time interval T, using said detector in particle counting mode to register spatiotemporal data relating to individual particle detection incidences, and to output said spatiotemporal data in raw form, without assembly into pixel arrays;
   sub-dividing said time interval T into a plurality of component time intervals $T_n$;
   for each component time interval $T_n$, assembling a corresponding dose fraction dataset $D_n$ using spatiotemporal data acquired during $T_n$, thus producing a set $\{D_n\}$ of dose fraction datasets;
   comparing at least two of said dose fraction datasets to one another, and using this comparison to determine said correction; and
   in a subsequent rendering step, assembling a final image from said spatiotemporal data, while performing a mathematical correction operation.

2. A method according to claim 1, wherein said comparison is performed using at least one of:
   an Image Similarity Metric (ISM);
   a Mutual Information (MI) relation;
   a cross-correlation;
   mean Squared Difference (MSD);
   phase correlation; and
   local feature-based matching.

3. A method of claim 1, wherein said correction operation comprises a coordinate transformation for application to said spatiotemporal data.

4. A method of claim 1, wherein said correction operation is performed to mitigate at least one effect selected from the group comprising drift, coma, astigmatism, distortion, defocus, radiation damage to the specimen, and combinations hereof.

5. A method of claim 1, wherein a compression operation is performed on the acquired data, so as to reduce data redundancy.

6. A method of claim 1, wherein said correction operation comprises a filtering operation.

7. A method of claim 1, wherein the mathematical correction is performed before the spatiotemporal data is assembled into the final image.

8. A method of claim 1, wherein the detector outputting the spatiotemporal data in raw form corresponds to the detector outputting a data stream of individual particle detection events.

9. A method of claim 1, wherein the registering said spatiotemporal data relating to individual particle detection incidences, and the outputting said spatiotemporal data in raw form comprises spatiotemporal data not associated with particle detections corresponding to digital 0s.

10. A method according to claim 9, further comprising performing a compression operation on said spatiotemporal data that comprises:
   counting digital 0s that occur between non-zero values in said spatiotemporal data; and
   storing these zero counts.

11. A Transmission Charged Particle Microscope comprising:
   a source, for producing a beam of charged particles;
   a specimen holder, for holding a specimen;
   an illumination system, for irradiating said specimen with said charged particles;
   an imaging system, for directing charged particles that are transmitted through the specimen onto a detector;
   a controller, for controlling at least some aspects of the microscope's operation,
   characterized in that said controller is configured to perform the following actions:
   in an acquisition step, lasting a time interval T, using said detector in particle counting mode to register spatiotemporal data relating to individual particle detection incidences, and to output said spatiotemporal data in raw form, without assembly into pixel arrays;
   sub-dividing said time interval T into a plurality of component time intervals $T_n$;
   for each component time interval $T_n$, assembling a corresponding dose fraction dataset $D_n$ using spatiotemporal data acquired during $T_n$, thus producing a set $\{D_n\}$ of dose fraction datasets;
   comparing at least two of said dose fraction datasets to one another and using this comparison to determine said correction; and
   in a subsequent rendering step, assembling a final image from said spatiotemporal data, while performing a mathematical correction operation.

\* \* \* \* \*